United States Patent
Nguyen

(10) Patent No.: US 10,690,541 B2
(45) Date of Patent: Jun. 23, 2020

(54) INFRARED LENS SWITCH ASSEMBLIES

(71) Applicant: Hewlett Packard Enterprise Development LP, Houston, TX (US)

(72) Inventor: Tri Luong Nguyen, Santa Clara, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 22 days.

(21) Appl. No.: 16/040,783

(22) Filed: Jul. 20, 2018

(65) Prior Publication Data

US 2020/0025607 A1     Jan. 23, 2020

(51) Int. Cl.
| | |
|---|---|
| *G01J 1/42* | (2006.01) |
| *G02B 3/08* | (2006.01) |
| *G01J 1/04* | (2006.01) |
| *H03K 17/96* | (2006.01) |

(52) U.S. Cl.
CPC .......... *G01J 1/4228* (2013.01); *G01J 1/0411* (2013.01); *G01J 1/4204* (2013.01); *G02B 3/08* (2013.01); *H03K 17/9645* (2013.01)

(58) Field of Classification Search
CPC ...... G01J 1/4228; G01J 1/4204; G01J 1/0411; G02B 3/08; G06F 2200/1637; G06F 1/1694; G06F 3/0304; H03K 17/96; H03K 17/962; H03K 17/9625; H03K 17/9627; H03K 17/964; H03K 17/9645
See application file for complete search history.

(56) References Cited

U.S. PATENT DOCUMENTS

| | | | | |
|---|---|---|---|---|
| 6,121,869 A | * | 9/2000 | Burgess | H01H 3/141 200/511 |
| 7,687,731 B2 | * | 3/2010 | Ozawa | H01H 13/023 200/314 |
| 2004/0206615 A1 | * | 10/2004 | Aisenbrey | H01H 13/702 200/262 |
| 2012/0248990 A1 | * | 10/2012 | Goyal | H05B 33/0854 315/152 |
| 2015/0070181 A1 | * | 3/2015 | Fadell | G08B 21/22 340/628 |
| 2016/0198536 A1 | | 7/2016 | Britt et al. | |
| 2016/0334076 A1 | * | 11/2016 | Dong | F21V 7/0008 |
| 2016/0335881 A1 | * | 11/2016 | Dong | G08B 25/12 |

(Continued)

FOREIGN PATENT DOCUMENTS

| | | |
|---|---|---|
| CN | 107358694 A | 11/2017 |
| CN | 107509294 A | 12/2017 |
| KR | 101661582 B1 | 10/2016 |

OTHER PUBLICATIONS

Aws IoT Button, Retrieved Jun. 11, 2018, 6 Pgs.
Thingstream Button, Retrieved Jun. 11, 2018, 2 Pgs.

*Primary Examiner* — Que Tan Le
*Assistant Examiner* — Jennifer D Bennett
(74) *Attorney, Agent, or Firm* — Hewlett Packard Enterprise Patent Department

(57) ABSTRACT

An example device can include a circuit assembly, an infrared sensor coupled to the circuit assembly, a switch coupled to the circuit assembly, an infrared lens coupled to a resistive element to alter a state of the switch when the infrared lens alters a position of the resistive element, and a light pipe ring positioned around the infrared lens to allow visible light to pass between an exterior and interior portion of an enclosure.

19 Claims, 5 Drawing Sheets

(56) References Cited

U.S. PATENT DOCUMENTS

2017/0345420 A1   11/2017  Barnett, Jr.
2019/0208095 A1*   7/2019  Kraz ...................... F21K 9/237
2019/0226915 A1*   7/2019  Zhang ..................... G01J 5/025

* cited by examiner

INFRARED LENS SWITCH ASSEMBLIES

BACKGROUND

A network may include a plurality of access points. The network can be an internet of things (IoT) network. An IoT network can include a plurality of physical devices that are enabled to connect and exchange data between other devices of the plurality of devices. The plurality of devices can include hardware, instructions, sensors, actuators, and/or networking devices to connect and exchange data with other devices of the plurality of devices.

DETAILED DESCRIPTION

Figure 1:
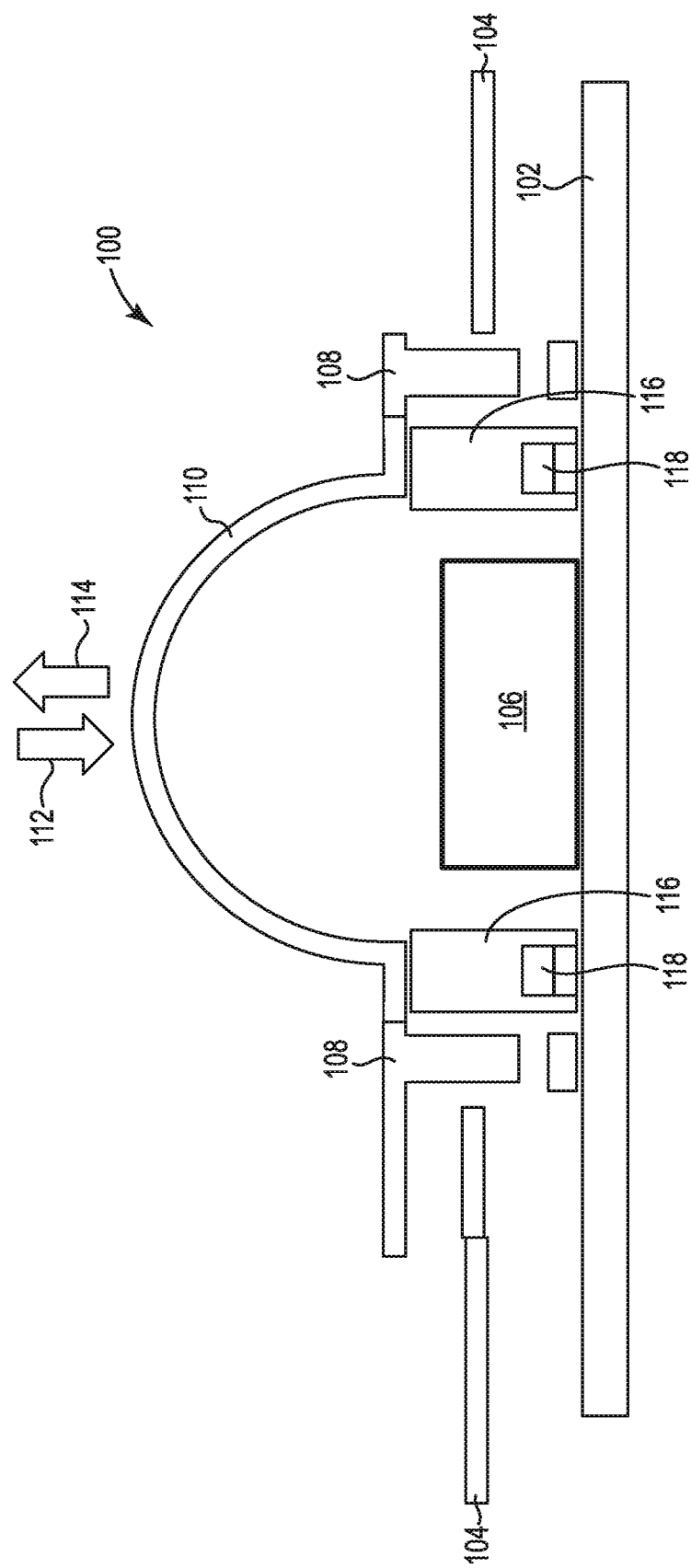
FIG. 1 is an example two-dimensional cross section view of a device with a switch assembly consistent with the present disclosure.

A number of systems and devices for an infrared lens switch assembly are described herein. In some examples, the infrared lens switch assembly can be utilized with devices that utilize a relatively small physical footprint. As used herein, a physical footprint can be physical dimensions of a physical device. For example, the physical footprint of a device can be the width, height, and length of the device. In some examples, the infrared lens switch assembly can be a multifunction switch or multifunction button that can be utilized to perform a plurality of functions for a device. In this way, the infrared lens switch assembly can take up relatively less space compared to other devices or systems for performing the plurality of functions, which can allow for a relatively small device to maintain a relatively small physical footprint.

In some examples, a device can utilize the infrared lens switch assembly with a computing device to receive inputs and provide signals. For example, the device can include a circuit assembly or computing device that is coupled to the infrared lens switch assembly to receive inputs and provide signals. In some examples, the infrared lens switch assembly can include an infrared sensor coupled to the circuit assembly. As used herein, an infrared sensor can include a passive infrared sensor (PIR sensor) that can measure infrared light radiating from objects in the field of view of the sensor. In some examples, the infrared sensor can be utilized to detect the motion of objects within the field of view of the sensor.

In some examples, the device can include a switch coupled to the circuit assembly. As used herein, a switch can include a device for making and breaking a connection in an electric circuit. For example, a switch can be closed to complete an electrical connection of the circuit assembly and the switch can be open to disconnect the electrical connection of the circuit assembly. In some examples, an infrared lens can be coupled to a resistive element to alter a state of the switch when the infrared lens alters a position of the resistive element.

For example, the infrared lens can act as a button for the infrared lens switch assembly. In this example, the infrared lens can be depressed to alter a state of the switch, which can open or close one or more circuits of the circuit assembly. In some examples, the device can include a light pipe ring positioned around the infrared lens to allow visible light to pass between an exterior and interior portion of an enclosure. In some examples, the light pipe ring can allow a light source to provide signals to an exterior portion of the device. In some examples, the light pipe ring can be utilized to allow light in the visible spectrum to pass to an interior portion of the device.

In some examples, the infrared lens switch assembly can provide a plurality of functions for the device. For example, the infrared lens can be utilized to focus infrared light on to an infrared sensor coupled to the circuit assembly. In another example, the infrared lens can act as a button to alter a state of a switch coupled to the circuit assembly. In some examples, the infrared lens switch assembly can provide the plurality of functions for the device with a relatively smaller physical footprint than other types of devices. In this way, the physical footprint of the overall device can be reduced compared to other types of devices.

FIG. 1 is an example two-dimensional cross section view of a device 100 with a switch assembly consistent with the present disclosure. In some examples, the device 100 can be a device that can be utilized as part of an internet of things (IoT) network. For example, the device 100 can be a device that can receive and transmit data with other devices of an IoT network. In some examples, the device 100 can be utilized to detect ambient light, detect movement, provide signals, and/or provide notifications. In some examples, the device 100 can transmit data that is detected and/or data that is provided through signals or notifications.

In some examples, the device 100 can include a circuit assembly 102. In some examples, the circuit assembly can include a printed circuit board (PCB) and/or a printed circuit assembly (PCA). As used herein, a PCB or PCA can be a device and/or component that mechanically supports and electrically connects electronic components using conductive material etched or printed between sheet layers of non-conductive materials.

In some examples, the circuit assembly 102 can include a plurality of electrical components or computing components. For example, the circuit assembly 102 can include an infrared sensor 106 that is electrically coupled and/or communicatively coupled to the circuit assembly 106. As used herein, electrically coupled devices can be devices that can receive electrical power through a conductive material. As used herein, communicatively coupled can be devices that can receive and/or send communication signals to other devices or elements.

In some examples, the device 100 can include an enclosure 104. In some examples, the enclosure 104 can enclose or surround the circuit assembly 102. In some examples, the enclosure 104 can be utilized to protect the circuit assembly 102 and/or devices coupled to the circuit assembly 102. In some examples, the enclosure 104 can comprise a material that is capable of protecting the circuit assembly 102 and/or devices coupled to the circuit assembly 102. In some examples, the enclosure 104 can comprise a material that prevents visible light from passing through the enclosure 104. For example, the enclosure 104 can comprise a material that is not a transparent material.

In some examples, the device 100 can include an infrared (IR) lens 110. As used herein, the infrared lens 110 can be a lens utilized to collect, focus, or collimate light in the near-infrared, short-wave infrared, mid-wave infrared, or long-wave infrared spectrum. In some examples, the infrared lens 110 can be optical lenses that utilize substrates or anti-reflection coatings to focus light in the infrared spectrum on to the infrared sensor 106 coupled to the circuit assembly 102. In some examples, the infrared lens 110 can focus the light in the infrared spectrum on to the infrared sensor 106 such that the infrared sensor 106 can be utilized to detect motion within a physical proximity of the infrared sensor 106 based on the received light in the infrared spectrum.

In some examples, the device 100 can include a resistive element 116 coupled to the infrared lens 110. As used herein, a resistive element 116 can include a compressible element or spring loaded element that when compressed provides a force in an opposite direction. For example, the resistive element 116 can include a compressible foam material that when compressed by a force in the direction of arrow 112 can apply an opposite force in the direction of arrow 114 when the force in the direction of arrow 112 is released. In some examples, the resistive element 116 can be coupled to an edge portion of the infrared lens 110. For example, the resistive element 116 can be coupled to an edge of the infrared lens 110 to allow infrared light to pass through the infrared lens 110 without being altered or blocked by the resistive element 116.

In some examples, the device 100 can include a switch 118 that is coupled to the circuit assembly 102. In some examples, the switch 118 can be an electrical switch that can be utilized to close or open electrical circuits of the circuit assembly 102. In some examples, the switch 118 can be activated or deactivated when the resistive element 116 is compressed in the direction of arrow 112 or when the resistive element 116 applies the opposite force in the direction of arrow 114. In some examples, the switch 118 can be a carbon-graphite pill that can be coupled to the circuit assembly 102. As used herein, a carbon-graphite pill can be a device that can make contact with the circuit assembly when the resistive element 116 is compressed in the direction of arrow 112.

In some examples, the switch 118 can be coupled to the resistive element 116. For example, the switch 118 can be coupled to the resistive element 116 such that the switch 118 is positioned between the circuit assembly 102 and the resistive element 116. In these examples, the resistive element 116 can be compressed by a force in the direction of arrow 112 to move the switch 118 to be in contact with the circuit assembly 102. In these examples, the force applied by the resistive element in the direction of arrow 114 can move the switch 118 out of contact with the circuit assembly 102.

In some examples, the switch 118 can initiate a function of the circuit assembly 102. For example, when the switch 118 makes contact with the circuit assembly 102, a particular function can be performed by the circuit assembly 102. In some examples, the switch 118 can initiate a plurality of different functions of the circuit assembly 102. For example, a first function can be performed by the circuit assembly 102 in response to the switch 118 making contact with the circuit assembly 102 a first time. In this example, a second function can be performed by the circuit assembly 102 in response to the switch 118 making contact with the circuit assembly 102 a second time. In this example, a third function can be performed by the circuit assembly 102 in response to the switch 118 making contact with the circuit assembly 102 a plurality of times (e.g., two times, etc.) within a threshold period of time. In some examples, the functions performed by the circuit assembly 102 in response to the switch 118 making contact with the circuit assembly 102 can include functions of an IoT network device. For example, the functions performed by the circuit assembly 102 can include, but are not limited to: start utilizing a particular sensor, stop utilizing a particular sensor, calibrate a particular sensor or the circuit assembly, and/or start/restart a sensor session.

In some examples, the device 100 can include a light pipe ring 108. As used herein, a light pipe ring 108 can be a device that can transmit or distribute light in the visible spectrum. In some examples, the light pipe ring 108 can be utilized to transfer light in the visible spectrum from the outside of the enclosure 104 to the inside of the enclosure 104 and transfer light in the visible spectrum from the inside of the enclosure 104 to the outside of the enclosure 104.

In some examples, the light pipe ring 108 can be positioned around the infrared lens 110 to allow visible light to pass between an exterior and interior portion of an enclosure. In some examples, the light pipe ring 108 can surround a perimeter of the infrared lens 110. For example, a base of the infrared lens 110 can be circular. In this example, the light pipe ring 108 can be a circular light pipe ring that surrounds the base of the infrared lens 110.

In some examples, the light pipe ring 108 can be coupled to the infrared lens 110. In some examples, the light pipe ring 108 can be permanently or semi-permanently coupled to a base portion of the infrared lens 110. In some examples, the infrared lens 110 can be a domed shaped infrared lens that has a circular base. In these examples, the light pipe ring 108 can be coupled to the perimeter of the circular base. In some examples, a portion of the light pipe ring 108 can be coupled between the infrared lens 110 and the resistive element 116.

In some examples, the device 100 can be an IoT device that includes a multifunction button assembly. As described herein, the device can include an IR lens 110 that can be utilized as a button to activate and deactivate a switch 118. In some examples, the multifunction button assembly that utilizes the IR lens 110 as a button can provide a relatively smaller footprint compared to utilizing separate buttons or switches than the IR lens 110. In this way, the device 100 can have a relatively smaller footprint while still providing the functionality of devices with a relatively larger footprint.

Figure 2:
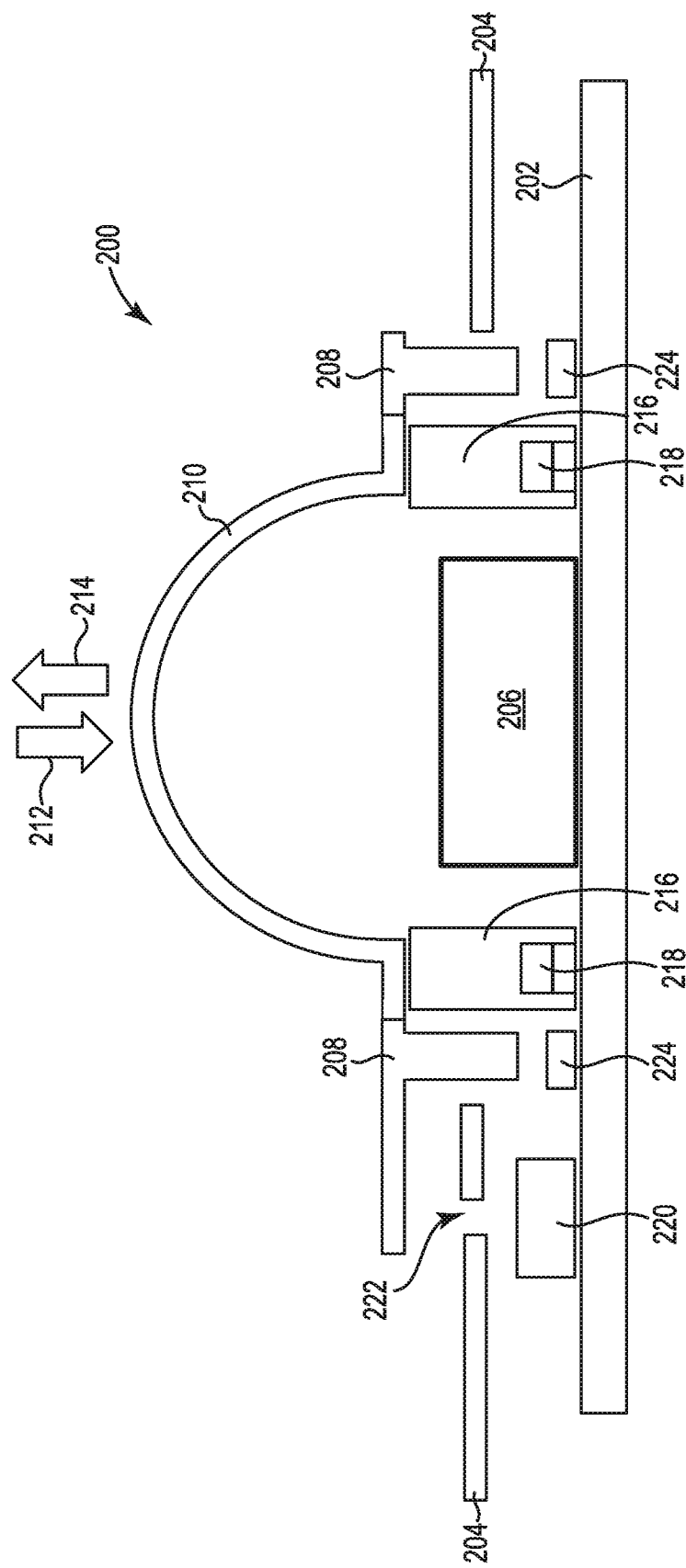
FIG. 2 is an example of a device with a switch assembly consistent with the present disclosure.

FIG. 2 is an example of a device 200 with a switch assembly consistent with the present disclosure. In some examples, the device 200 can be a device that can be utilized as part of an internet of things (IoT) network. For example, the device 200 can be a device that can receive and transmit data with other devices of an IoT network. In some examples, the device 200 can be utilized to detect ambient light, detect movement, provide signals, and/or provide notifications. In some examples, the device 200 can transmit data that is detected and/or data that is provided through signals or notifications.

In some examples, the device 200 can include a circuit assembly 202. As described herein, the circuit assembly 202 can include a printed circuit board (PCB) and/or a printed circuit assembly (PCA). In some examples, the circuit assembly 202 can include a plurality of electrical components or computing components. For example, the circuit assembly 202 can include an infrared (IR) sensor 206 that is electrically coupled and/or communicatively coupled to the circuit assembly 206. In some examples, the device 200 can include an enclosure 204. In some examples, the enclosure 204 can enclose or surround the circuit assembly 202.

In some examples, the device 200 can include an infrared (IR) lens 210. In some examples, the infrared lens 210 can focus light in the infrared spectrum on to the infrared sensor 206 such that the infrared sensor 206 can be utilized to detect motion based on the received light in the infrared spectrum. In some examples, the device 200 can include a resistive element 216 coupled to the infrared lens 210. As described herein, the resistive element 216 can be compressed in the direction of arrow 212 and the resistive element 216 can provide a force in the direction of arrow 214.

In some examples, the device 200 can include a switch 218 that is coupled to or interacts with the circuit assembly 202. In some examples, the switch 218 can be a carbon-graphite pill that is coupled to the resistive element 216 such that the switch 218 can interact with the circuit assembly 202 when the resistive element 216 is compressed in the direction of arrow 212. For example, the switch 218 can be coupled to the resistive element 216 such that the switch 218 is positioned between the circuit assembly 202 and the resistive element 216. As described herein, the switch 218 can initiate a function of the circuit assembly 202. For example, when the switch 218 makes contact with the circuit assembly 202 a particular function can be performed by the circuit assembly 202.

In some examples, the device 200 can include a light pipe ring 208. As used herein, a light pipe ring 208 can be a device that can transmit or distribute light in the visible spectrum. In some examples, the light pipe ring 208 can be utilized to transfer light in the visible spectrum from the outside of the enclosure 204 to the inside of the enclosure 204 and transfer light in the visible spectrum from the inside of the enclosure 204 to the outside of the enclosure 204.

In some examples, the device 200 can include an ambient light sensor 220 coupled to the circuit assembly 202. As used herein, the ambient light sensor 220 can include a device for detecting the presence or absence of light in the visible spectrum. In some examples, the ambient light sensor 220 can be positioned to receive light in the visible spectrum through the light pipe ring 208. That is, the ambient light sensor 220 can be positioned between the circuit assembly 202 and the light pipe ring 208, such that light in the visible spectrum that passes through the light pipe ring 208 can be received by the ambient light sensor 220. In some examples, the light pipe ring 208 can be utilized to focus light in the visible spectrum from the outside of the enclosure 204 on to the ambient light sensor 220 positioned inside the enclosure 204.

In some examples, a portion of the enclosure 204 can be positioned between the light pipe ring 208 and the ambient light sensor 220. In these examples, the enclosure 204 can include an aperture 222. In some examples, the aperture 222 can be positioned between the light pipe ring 208 and the ambient light sensor 220. In some examples, the aperture 222 can be utilized to allow light in the visible spectrum to pass from the light pipe ring 208 to the ambient light sensor 220. In some examples, the aperture 220 can be utilized to couple a visible light lens. For example, a clear material or substantially transparent material can be positioned within the aperture 222 to allow light in the visible spectrum to pass through the aperture 222. In some examples, the visible light lens positioned within the aperture can be utilized to focus light onto the ambient light sensor 220. For example, the visible light lens can be an optical lens that focuses light from the light pipe ring 208 to the ambient light sensor 220.

In some examples, the device 200 can include a light source 224 coupled to the circuit assembly 202. As used herein, a light source 224 can include a device that is capable of producing light in the visible spectrum. For example, the light source 224 can be a light bulb or light emitting diode (LED) that can produce light in the visible spectrum. In some examples, the light source 224 can be a notification light source. For example, the light source 224 can be utilized to provide messages to a user positioned outside the enclosure 204. In some examples, the light source 224 can be activated, deactivated, or actively transitioning between activated and deactivated to generate a message. For example, the light source 224 can be activated to generate a solid stream of light, deactivated to stop generating light, and/or actively transitioning to generate a blinking or pulsing message of light in the visible spectrum. In some examples, the light source 224 can be utilized to provide signals to notify a user of a status of the device 200.

In some examples, the light source 224 can be coupled to the circuit assembly 202 such that the light source 224 is positioned between the circuit assembly 202 and the light pipe ring 208. As described herein, the light pipe ring 208 can allow visible light to pass from the inside of the enclosure 204 to the outside of the enclosure 204. In this way, light that is generated by the light source 224 can pass through the light pipe ring 208 to be visible from the outside of the enclosure 204. In some examples, the light pipe ring 208 can be utilized to focus or disperse the light generated by the light source 224 to alter a size or shape of the light generated by the light source 224.

In some examples, the device 200 can be an IoT device that includes a multifunction button assembly. As described herein, the device 200 can include an IR lens 210 that can be utilized as a button to activate and deactivate a switch 218. In some examples, the multifunction button assembly that utilizes the IR lens 210 as a button can provide a relatively smaller footprint compared to utilizing separate buttons or switches than the IR lens 210. In addition, the light pipe ring 208 can allow ambient light sensors 220 and light sources 224 to be positioned on the same circuit assembly 202 as the IR sensor 206. In this way, the device 200 can have a relatively smaller footprint while still providing the functionality of devices with a relatively larger footprint.

Figure 3:
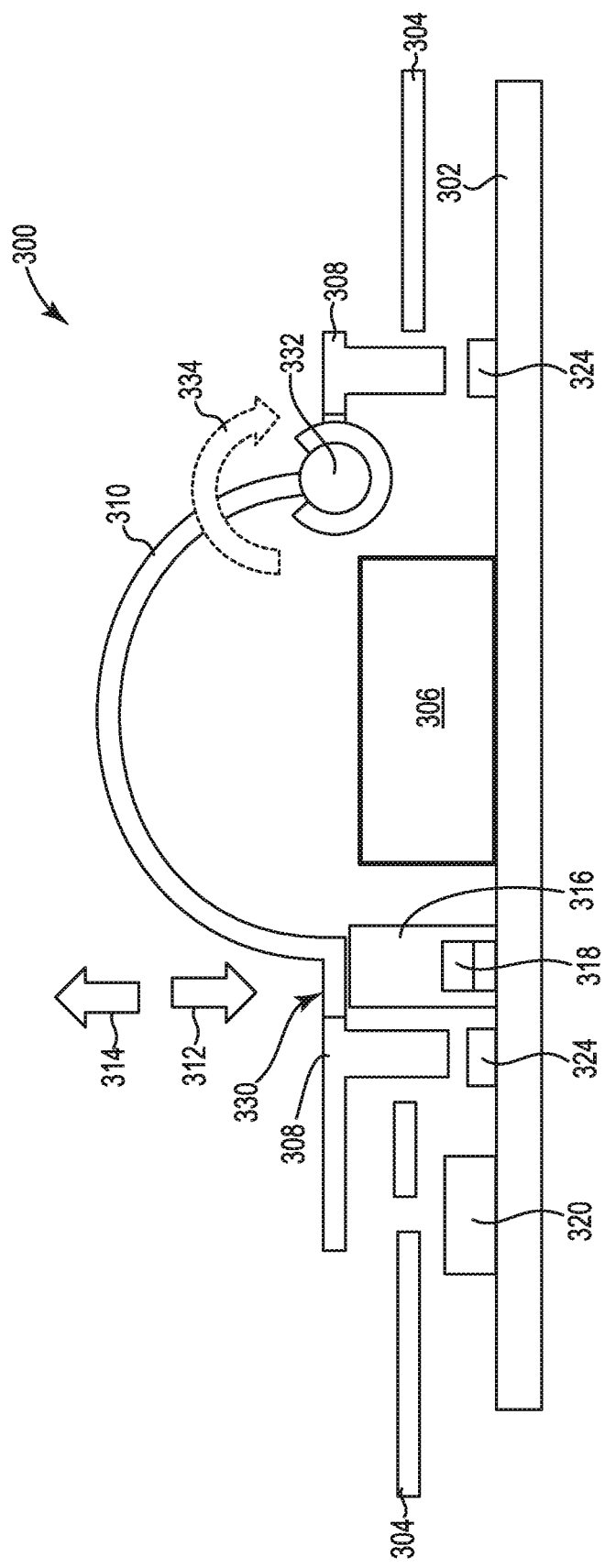
FIG. 3 is another example of a device with a switch assembly consistent with the present disclosure.

FIG. 3 is another example of a device 300 with a switch assembly consistent with the present disclosure. In some examples, the device 300 can be a device that can be utilized as part of an internet of things (IoT) network. In some examples, the device 300 can be utilized to detect ambient light with an ambient light sensor 320, detect movement with an infrared sensor 306, provide signals with a light source 324, and/or provide notifications with the light source 324. In some examples, the device 300 can wirelessly transmit data to another IoT network device that is detected and/or data that is provided through signals or notifications.

In some examples, the device 300 can include a circuit assembly 302. As described herein, the circuit assembly 302 can include a printed circuit board (PCB) and/or a printed circuit assembly (PCA). In some examples, the circuit assembly 302 can include a plurality of electrical components or computing components. For example, the circuit assembly 302 can include an infrared sensor 306 that is electrically coupled and/or communicatively coupled to the circuit assembly 306. In some examples, the device 300 can include an enclosure 304. In some examples, the enclosure 304 can enclose or surround the circuit assembly 302.

In some examples, the device 300 can include an infrared lens 310. In some examples, the infrared lens 310 can focus light in the infrared spectrum on to the infrared sensor 306 such that the infrared sensor 306 can be utilized to detect motion based on the received light in the infrared spectrum. In some examples, the device 300 can include a resistive element 316 coupled to the infrared lens 310. As described herein, the resistive element 316 can be compressed in the direction of arrow 312 and the resistive element 316 can provide a force in the direction of arrow 314.

In some examples, the device 300 can include a hinge 332 that can be coupled to a side or portion of the infrared lens 310. In some examples, the infrared lens 310 can be utilized as a button for depressing the resistive element 316 in the direction of arrow 312. In these examples, the hinge 332 can rotate in an opposite direction of arrow 334 when the infrared lens 310 is depressed in the direction of arrow 312. In these examples, the hinge 332 can rotate in the direction of arrow 334 when the infrared lens 310 is not depressed and the resistive element 316 is providing a force in the direction of arrow 314.

In some examples, the hinge 332 can be a loaded hinge that includes a resistive force. For example, the hinge 332 can be a spring loaded hinge that can apply a force in the direction of arrow 334. In some examples, a loaded hinge can be utilized to help the resistive element 316 move the infrared lens 310 in the direction of arrow 314. In another example, the hinge 332 can be a loaded hinge that can replace the function of the resistive element 316. That is, the hinge 332 can be utilized to allow the infrared lens 310 to move in the direction of arrow 312 when pressure is applied to the infrared lens 310 and provide a force in the direction of arrow 334 when pressure is not applied to the infrared lens 310.

In some examples, the device 300 can utilize a contact point 330. In some examples, the contact point 330 can be a position of the device 300 that can be depressed by a force to alter a state of the switch 318. For example, the contact point 330 can be positioned on an opposite edge or portion of the infrared lens 310 than the hinge 332. In this example, the contact point 330 can be depressed to activate or deactivate the switch 318 as described herein.

As described herein, the device 300 can include a switch 318 that is coupled to or interacts with the circuit assembly 302. In some examples, the switch 318 can be a carbon-graphite pill that is coupled to the resistive element 316 such that the switch 318 can interact with the circuit assembly 302 when the resistive element 316 is compressed in the direction of arrow 312 or when the hinge 332 is rotated in a direction that is opposite to arrow 334. For example, the switch 318 can be coupled to the resistive element 316 such that the switch 318 is positioned between the circuit assembly 302 and the resistive element 316. As described herein, the switch 318 can initiate a function of the circuit assembly 302. For example, when the switch 318 makes contact with the circuit assembly 302 a particular function can be performed by the circuit assembly 302.

In some examples, the device 300 can include a light pipe ring 308. As used herein, a light pipe ring 308 can be a device that can transmit or distribute light in the visible spectrum. In some examples, the light pipe ring 308 can be utilized to transfer light in the visible spectrum from the outside of the enclosure 304 to the inside of the enclosure 304 and transfer light in the visible spectrum from the inside of the enclosure 304 to the outside of the enclosure 304.

In some examples, the device 300 can be an IoT device that includes a multifunction button assembly. As described herein, the device 300 can include an infrared lens 310 that can be utilized as a button to activate and deactivate a switch 318. In some examples, the multifunction button assembly that utilizes the infrared lens 310 as a button can provide a relatively smaller footprint compared to utilizing separate buttons or switches than the infrared lens 310. In addition, the light pipe ring 308 can allow ambient light sensors 320 and light sources 324 to be positioned on the same circuit assembly 302 as the infrared sensor 306. In this way, the device 300 can have a relatively smaller footprint while still providing the functionality of devices with a relatively larger footprint.

Figure 4:
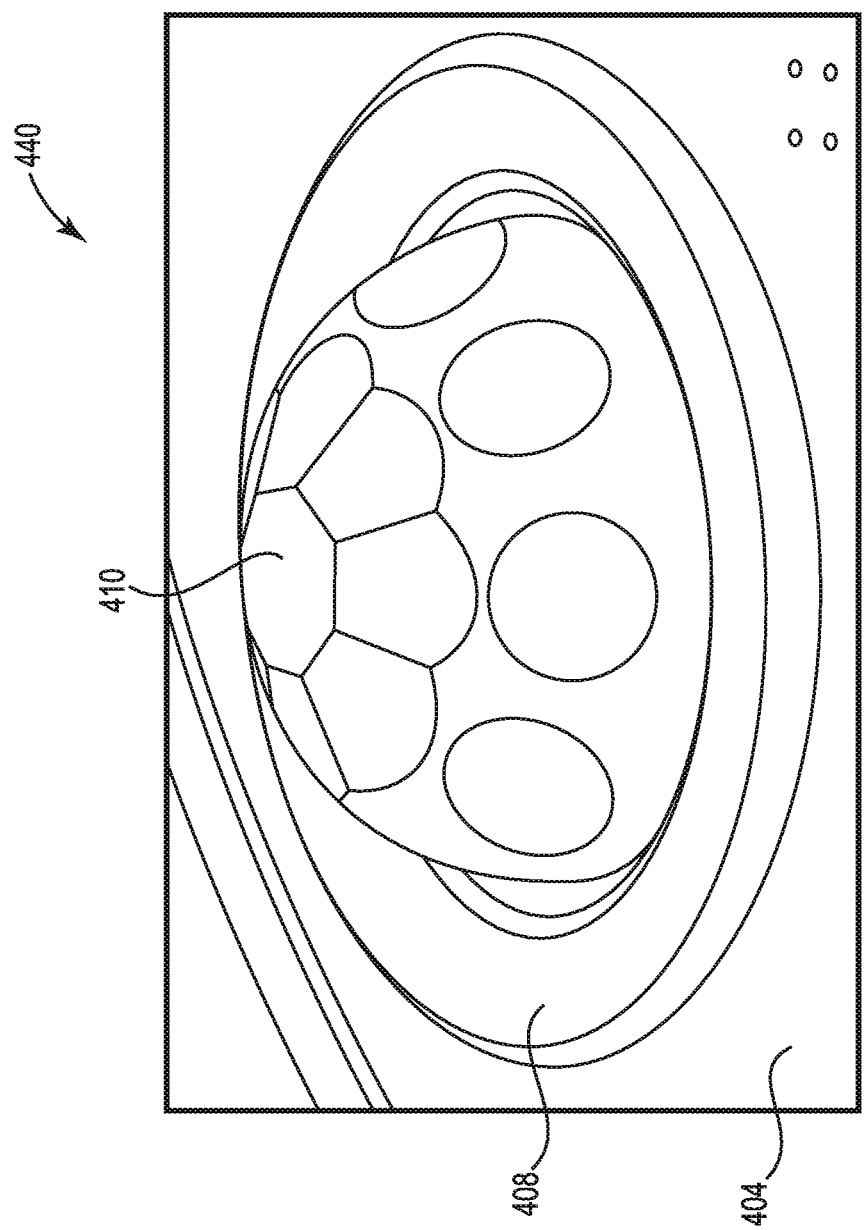
FIG. 4 is an example of multifunction button for an internet of things device consistent with the present disclosure.

FIG. 4 is an example of multifunction button 440 for an internet of things device consistent with the present disclosure. In some examples, the device 100 as referenced in FIG. 1, device 200 as referenced in FIG. 2, and/or device 300 as referenced in FIG. 3 can be utilized as a multifunction button 440. For example, the multifunction button 440 can include an infrared lens 410, a light pipe ring 408 that surrounds the infrared lens 410, and/or an enclosure 404 to protect electronics within the enclosure 404.

As described herein, the infrared lens 410 can focus light in the infrared spectrum on to an infrared sensor positioned within the enclosure 404 such that the infrared sensor can be utilized to detect motion based on the received light in the infrared spectrum. In some examples, the infrared lens 410 can be utilized as a button or contact point for activating and deactivating a switch. For example, a force can be applied to a surface of the infrared lens 410 to depress a resistive element and allow the switch to be activated or deactivated. In some examples, the infrared lens 410 can be a dome shape. As used herein, a dome shape can include a rounded vault shape with a circular or substantially circular base. In some examples, the rounded vault shape of the infrared lens 410 can extend above a surface of the enclosure 404 to allow the infrared lens 410 to be more easily accessible.

In some examples, the infrared lens 410 can be surrounded by a light pipe ring 408. As described herein, a light pipe ring 408 can be a device that can transmit or distribute light in the visible spectrum. In some examples, the light pipe ring 408 can be utilized to transfer light in the visible spectrum from the outside of the enclosure 404 to the inside of the enclosure 404 and transfer light in the visible spectrum from the inside of the enclosure 404 to the outside of the enclosure 404. In some examples, the light pipe ring 408 can allow light from the outside of the enclosure 404 transferred to a sensor such as an ambient light sensor. In some examples, the light pipe ring 408 can be utilized to allow light from a light source inside the enclosure 404 to be displayed to the outside of the enclosure 404.

Figure 5:
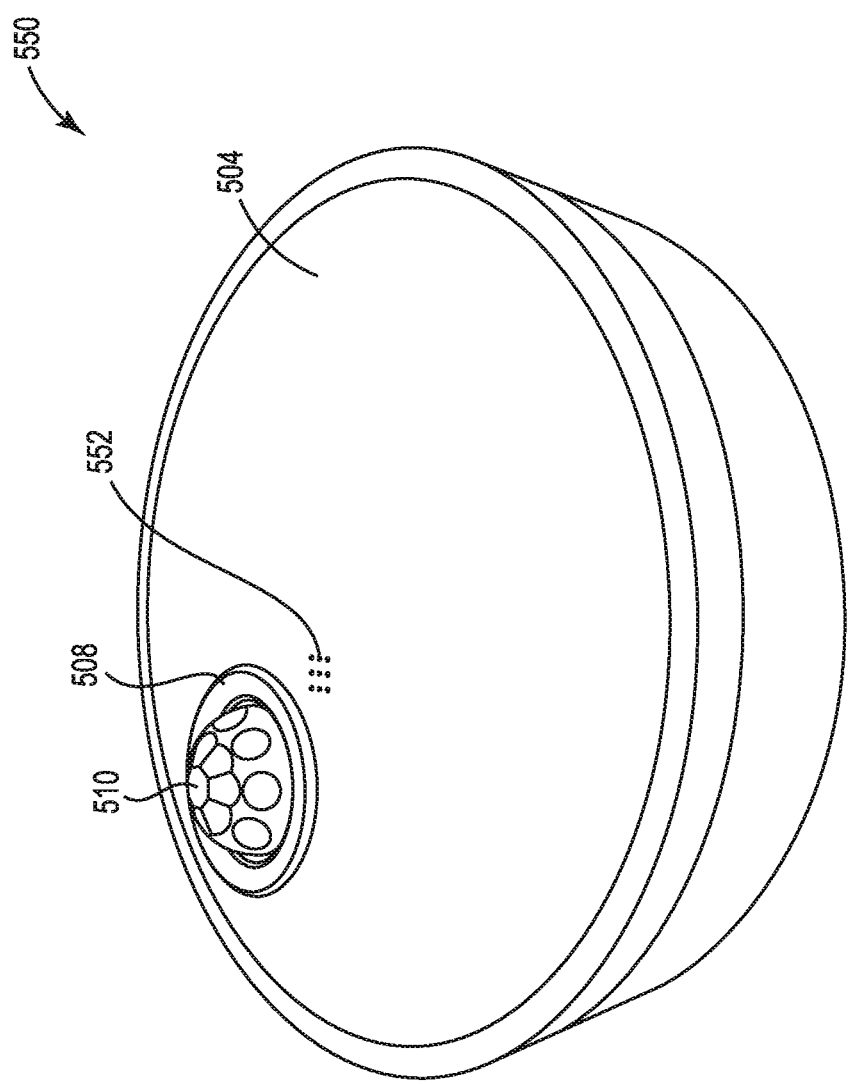
FIG. 5 is an example of an internet of things device with a multifunction button.

FIG. 5 is an example of an internet of things (IoT) device 550 with a multifunction button. In some examples, the device 100 as referenced in FIG. 1, device 200 as referenced in FIG. 2, device 300 as referenced in FIG. 3, and/or the multifunction button 440 can be utilized with the IoT device 550. For example, the IoT device 550 can include an infrared lens 510, a light pipe ring 508 that surrounds the infrared lens 510, and/or an enclosure 504 to protect electronics within the enclosure 504.

As described herein, the infrared lens 510 can focus light in the infrared spectrum on to an infrared sensor positioned within the enclosure 504 such that the infrared sensor can be utilized to detect motion based on the received light in the infrared spectrum. In some examples, the infrared lens 510 can be utilized as a button or contact point for activating and deactivating a switch. For example, a force can be applied to a surface of the infrared lens 510 to depress a resistive element and allow the switch to be activated or deactivated. In some examples, the infrared lens 510 can be a dome shape. As used herein, a dome shape can include a rounded vault shape with a circular or substantially circular base. In some examples, the rounded vault shape of the infrared lens 510 can extend above a surface of the enclosure 504 to allow the infrared lens 510 to be more easily accessible.

In some examples, the infrared lens 510 can be surrounded by a light pipe ring 508. As described herein, a light pipe ring 508 can be a device that can transmit or distribute light in the visible spectrum. In some examples, the light pipe ring 508 can be utilized to transfer light in the visible spectrum from the outside of the enclosure 504 to the inside of the enclosure 504 and transfer light in the visible spectrum from the inside of the enclosure 504 to the outside of the enclosure 504. In some examples, the light pipe ring 508 can allow light from the outside of the enclosure 504 transferred to a sensor such as an ambient light sensor. In some examples, the light pipe ring 508 can be utilized to allow light from a light source inside the enclosure 504 to be displayed to the outside of the enclosure 504.

In some examples, the IoT device 550 can include an aperture 552. In some examples, the aperture 552 can be utilized to allow sound waves to more easily pass through the enclosure. In some examples, the aperture 552 can include a number of holes to allow a speaker coupled to a circuit assembly to transmit sound waves to a user outside the enclosure 504. In some examples, the aperture 552 can be a number of holes to allow a microphone coupled to the circuit assembly to receive sound waves from a user outside the enclosure 504.

As described herein, an IoT device 550 can be a device that can receive and transmit data with other devices of an IoT network. In some examples, the IoT device 550 can be utilized to detect ambient light, detect movement, provide signals, and/or provide notifications. In some examples, the IoT device 550 can transmit data that is detected and/or data that is provided through signals or notifications. In some examples, the multifunction button of the IoT device 550 can provide a relatively smaller footprint on the surface of the enclosure 504 of the IoT device 550.

In this way, the remaining surface of the enclosure 504 can be utilized for other purposes (e.g., mounting the IoT device 550, coupling devices to the enclosure 504 of the IoT device 550, etc.). In some examples, the multifunction button assembly of the IoT device 550 can provide a relatively smaller footprint on the surface of the enclosure 504 of the IoT device 550 can be utilized to decrease a footprint of the IoT device 550. That is, a smaller enclosure 504 can be utilized for the IoT device 550 compared to other IoT devices that utilize multiple devise that perform the functions of the multifunction button assembly.

In the foregoing detail description of the present disclosure, reference is made to the accompanying drawings that form a part hereof, and in which is shown by way of illustration how examples of the disclosure may be practiced. These examples are described in sufficient detail to enable those of ordinary skill in the art to practice the examples of this disclosure, and it is to be understood that other examples may be utilized and that structural changes may be made without departing from the scope of the present disclosure.

The figures herein follow a numbering convention in which the first digit corresponds to the drawing figure number and the remaining digits identify an element or component in the drawing. Elements shown in the various figures herein can be added, exchanged, and/or eliminated so as to provide a number of additional examples of the present disclosure. In addition, the proportion and the relative scale of the elements provided in the figures are intended to illustrate the examples of the present disclosure, and should not be taken in a limiting sense. Further, as used herein, "a number of" an element and/or feature can refer to any number of such elements and/or features.

What is claimed:

1. A device, comprising:
    a circuit assembly;
    an infrared sensor coupled to the circuit assembly;
    a switch coupled to the circuit assembly;
    an infrared lens coupled to a hinge on a first edge and coupled to a resistive element to alter a state of the switch when the infrared lens alters a position of the resistive element; and
    a light pipe ring positioned around the infrared lens to allow visible light to pass between an exterior and interior portion of an enclosure, wherein the hinge is coupled between the infrared lens and the light pipe ring.

2. The device of claim 1, wherein the resistive element is positioned between infrared sensor and the light pipe ring.

3. The device of claim 1, wherein the switch is a carbon graphite pill activated when pressure is applied to the resistive element.

4. The device of claim 1, comprising a light source coupled to the circuit assembly to project light through the light pipe ring.

5. The device of claim 4, wherein the resistive element is positioned between the infrared sensor and light source to separate the infrared sensor and the light source.

6. The device of claim 1, comprising an ambient light sensor coupled to the circuit assembly to receive light through the light pipe ring.

7. A system, comprising:
    an enclosure;
    a circuit assembly positioned within the enclosure;
    a resistive element switch coupled to the circuit assembly;
    an infrared lens coupled to a hinge on a first edge and coupled to the resistive element switch such that altering a position of the infrared lens activates or deactivates the resistive element switch;
    an infrared sensor coupled to the circuit assembly at a location between the circuit assembly and the infrared lens; and
    a light pipe ring coupled to a perimeter of the infrared lens to:
        allow visible light to enter the enclosure to be received by an ambient light sensor coupled to the circuit assembly; and
        allow visible light generated by a light source coupled to the circuit assembly to leave the enclosure, wherein the hinge is coupled between the infrared lens and the light pipe ring.

8. The system of claim 7, wherein the ambient light sensor is positioned between the circuit assembly and a first portion of the light pipe ring and the light source is positioned between the circuit assembly and a second portion of the light pipe ring.

9. The system of claim 7, wherein the resistive element switch includes a compressible foam material with carbon graphite pills coupled to the circuit assembly.

10. The system of claim 9, wherein the infrared lens transfers pressure to the compressible foam material to activate or deactivate the carbon graphite pills.

11. The system of claim 7, wherein the light pipe ring is positioned between the infrared lens and the enclosure.

12. The system of claim 7, wherein the resistive element switch surrounds a base of the infrared lens.

13. The system of claim 12, wherein the infrared sensor is positioned within the resistive element switch that surrounds the base of the infrared lens.

14. The system of claim 12, wherein the light source and the ambient light sensor are positioned outside the resistive element switch that surrounds the base of the infrared lens.

15. A multifunction button, comprising:
- a Fresnel infrared lens coupled to a hinge on a first edge and coupled to a resistive element switch on a second edge;
- an infrared sensor coupled to a circuit assembly between the first edge and the second edge of the Fresnel infrared lens;
- a light pipe ring coupled to the first edge and the second edge of the Fresnel infrared lens to allow light in the visible spectrum to pass through an enclosure, wherein the hinge is coupled between the Fresnel infrared lens and the light pipe ring.

16. The multifunction button of claim 15, wherein the Fresnel infrared lens is a depression surface of the multifunction button to activate or deactivate the resistive element switch.

17. The multifunction button of claim 15, wherein the hinge allows the Fresnel infrared lens to be depressed on the second edge to activate or deactivate the resistive element switch when the Fresnel infrared lens is depressed.

18. The multifunction button of claim 15, comprising a light source coupled to the circuit assembly between the circuit assembly and the light pipe ring.

19. The multifunction button of claim 15, wherein the circuit assembly is an internet of things (IOT) computing device.

* * * * *